(12) United States Patent
Gruening et al.

(10) Patent No.: US 6,184,091 B1
(45) Date of Patent: Feb. 6, 2001

(54) FORMATION OF CONTROLLED TRENCH TOP ISOLATION LAYERS FOR VERTICAL TRANSISTORS

(75) Inventors: Ulrike Gruening; Jochen Beintner, both of Wappingers Falls; Dirk Tobben; Gill Lee, both of Fishkill, all of NY (US); Oswald Spindler, Vaterstetten; Zvonimir Gabric, Zomeding, both of (DE)

(73) Assignee: Infineon Technologies North America Corp., San Jose, CA (US)

( * ) Notice: Under 35 U.S.C. 154(b), the term of this patent shall be extended for 0 days.

(21) Appl. No.: 09/241,756

(22) Filed: Feb. 1, 1999

(51) Int. Cl.$^7$ .................................................. H01L 21/336

(52) U.S. Cl. ........................... 438/270; 438/424; 438/294

(58) Field of Search ..................................... 438/243, 239, 438/238, 268, 270, 282, 294, 424, 778, 787

(56) References Cited

PUBLICATIONS

"A New STI Process Based on Selective Oxide Deposition", Elbel et al, 1998 Symposium on VLSI Technology Digest of Technical Papers, pp. 208–209.

*Primary Examiner*—Charles Bowers
*Assistant Examiner*—Evan Pert
(74) *Attorney, Agent, or Firm*—Donald B. Paschburg

(57) ABSTRACT

A method for controlling isolation layer thickness in trenches for semiconductor devices includes the steps of providing a trench having a conductive material formed therein, forming a liner on sidewalls of the trench above the conductive material, depositing a selective oxide deposition layer on the buried strap and the sidewalls, the selective oxide deposition layer selectively growing at an increased rate on the conductive material than on the liner of the sidewalls and top surface and removing the selective oxide deposition layer except for a portion in contact with the conductive to form an isolation layer on the conductive material in the trench. A method for fabricating vertical transistors by recessing a substrate to permit increased overlap between a transistor channel and buried strap out-diffusion when the transistor is formed is also included. A semiconductor device is also disclosed.

19 Claims, 8 Drawing Sheets

FORMATION OF CONTROLLED TRENCH TOP ISOLATION LAYERS FOR VERTICAL TRANSISTORS

BACKGROUND

1. Technical Field

This disclosure relates to semiconductor devices and more particularly, to a method for forming deep trench top isolation layers for semiconductor memories by employing a selective sub-atmospheric chemical vapor deposition oxide (SACVD-oxide).

2. Description of the Related Art

Semiconductor memories such as dynamic random access memories (DRAM) typically include memory cells with storage nodes. Generally these storage nodes are formed within deep trenches etched into substrates of the semiconductor memory chip. The storage nodes are accessed using an access transistor which allows charge to be stored in the storage node or retrieves charge from the storage depending on whether the desired action is a read or write function. It is often necessary to ensure that the storage node is sufficiently electrically isolated from a gate conductor through the top of the deep trench.

One way to ensure sufficient electrical isolation of the storage node through the top of the trench is to provide a top trench isolation layer over the storage node. The storage nodes typically include polysilicon material that partially fills the deep trench. During fabrication the polysilicon provides a recess remaining at the top of the trench. An oxide (silicon dioxide) is deposited over the surface of the semiconductor device. During the oxide deposition, oxide is formed over the polysilicon in the trench. Other portions of the deposited oxide are removed by planarizing the surface of the semiconductor device and by optionally recessing the oxide to leave a 30–50 nm oxide layer at the bottom of the recess. This oxide layer is referred to as a trench top oxide or isolation. The oxide layer alone may not provide sufficient isolation however to fulfill reliability requirements.

In the case where vertical transistors are fabricated on the memory device, a buried strap portion of the storage node, i.e., the portion directly below the top trench oxide must outdiffuse to connect to a vertical transistor channel which extends along a gate conductor in the deep trench above the top trench oxide. In this way, when the vertical transistor conducts, a connection is made between the storage node and a bit line. The channel must be electrically isolated from the gate conductor. Therefore, an insulating layer is provided therebetween, typically an oxide layer formed by oxidizing a portion of the polysilicon of the gate conductor within the deep trench and the channel.

The oxide recessing is difficult to control. This difficulty introduces a lot of variability in the remaining oxide layer thickness. The trench top oxide thickness is an important parameter and must be maintained in order for the semiconductor memory to work properly. As described above, the trench top oxide electrically isolates the storage node from the gate conductor of the semiconductor device.

Therefore, a need exists for a trench top dielectric having a controlled thickness which can withstand the processing steps needed to fabricate a memory device.

SUMMARY OF THE INVENTION

A method for controlling isolation layer thickness in trenches for semiconductor devices includes the steps of providing a trench having a conductive material formed therein, forming a liner on sidewalls of the trench above the conductive material, depositing a selective oxide deposition layer on the conductive material and the sidewalls, the selective oxide deposition layer selectively growing at an increased rate on the conductive material than on the liner of the sidewalls and removing the selective oxide deposition layer except for a portion in contact with the conductive material to form an isolation layer on the conductive material in the trench.

In alternate methods, the step of depositing the selective oxide deposition layer may include depositing the selective oxide deposition layer by chemical vapor deposition. The selective oxide deposition layer may include an ozone activated TEOS oxide and the liner may include a nitride. The increased rate of growing is preferably about five times greater for the conductive material than on the liner of the sidewalls. The step of forming a liner on sidewalls may include forming a nitride liner. The thickness of the selective oxide deposition layer is preferably between about 10 nm to about 200 nm. The conductive material preferably includes polysilicon and may further include the step of densifying the polysilicon below the trench top isolation layer. The step of removing the liner from the trench sidewalls is also preferably included.

A method for fabricating a vertical transistor includes the steps of providing a substrate having trenches formed therein, each trench having a storage node formed therein, the storage node having a buried strap, forming a liner on sidewalls of the trench above the buried strap, depositing a selective oxide deposition layer on the buried strap and the sidewalls, the selective oxide deposition deposited layer selectively growing at an increased rate on the buried strap as compared to the liner of the sidewalls and removing the selective oxide deposition layer except for a portion in contact with the buried strap to form a trench top isolation layer, removing the liner from the sidewalls and forming a gate conductor in the trench such that a channel is formed adjacent to the gate conductor for providing electrical conduction between the buried strap and a conductive line upon activation of the gate conductor.

In alternate methods, the step of laterally etching the substrate to form a recess into the substrate such that the recess extends beyond sides of the trench may be included, the recess being in communication with the trench. The step of laterally etching may further include laterally etching by a dry etch process. The conductive line may comprise a bitline. The step of depositing the selective oxide deposition layer may include depositing the selective oxide deposition layer by chemical vapor deposition. The selective oxide deposition deposited layer preferably includes an ozone activated TEOS oxide and the liner includes a nitride. The increased rate of growing is preferably about five times greater for the buried strap than on the liner of the sidewalls. The step of forming a liner on sidewalls may include a nitride liner. The thickness of the selective oxide deposition layer is between about 10 nm to about 100 nm on the buried strap. The buried strap includes polysilicon and the step of densifying the polysilicon below the trench top isolation layer may also be included. The step of removing the liner from the trench sidewalls may be included.

A semiconductor memory is also provided which includes a substrate having a plurality of deep trenches formed therein, each deep trench having a buried strap formed therein for accessing a storage node disposed within the deep trench. An isolation layer is formed from a selectively growing a sub-atmospheric chemical vapor deposition material, the sub-atmospheric chemical vapor deposition material layer being formed on the buried strap by growing the sub-atmospheric chemical vapor deposition material layer at a faster rate on the buried strap than on sidewalls of the trench above the buried strap.

In alternate embodiments, the isolation layer preferably includes an an ozone activated TEOS. The thickness of the isolation layer is between about 10 nm to about 200 nm. An access transistor is preferably included and a gate is preferably formed in the trench having at least a portion of the gate in contact with the isolation layer. The transistor may include a channel formed in the substrate adjacent to the gate for electrically coupling the buried strap to a bitline. The substrate may include a recessed portion for enabling increased overlap between outdiffusion from the buried strap and the channel.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor devices and more particularly, to a method for forming deep trench top isolation layers for semiconductor memories by employing a selective sub-atmospheric chemical vapor deposition. The present invention provides an improved method for forming a top trench isolation layer over a storage node in a deep trench. The present invention advantageously employs a sub-atmospheric chemical vapor deposition (SACVD) process to deposit an oxide within the deep trench where the sidewalls have been lined with a nitride layer. The SACVD oxide is an ozone activated TEOS process which grows selectively at a deposition rate of about 5 times greater on silicon than on nitride. The SACVD or selective oxide deposition process preferably includes an ozone based sub-atmospheric chemical vapor deposition at pressures between about 50 to about 760 Torr in an $O_2/O_3$ and TEOS gas environment. Temperatures during deposition may be between about 300° C. to about 650° C. Selectivity in deposition rate between silicon and nitride is about 2 to 25:1, preferably from 5 to 10:1. In this way, the trench top isolation layer is formed in a more controlled way as will be described in more detail below.

Figure 1:
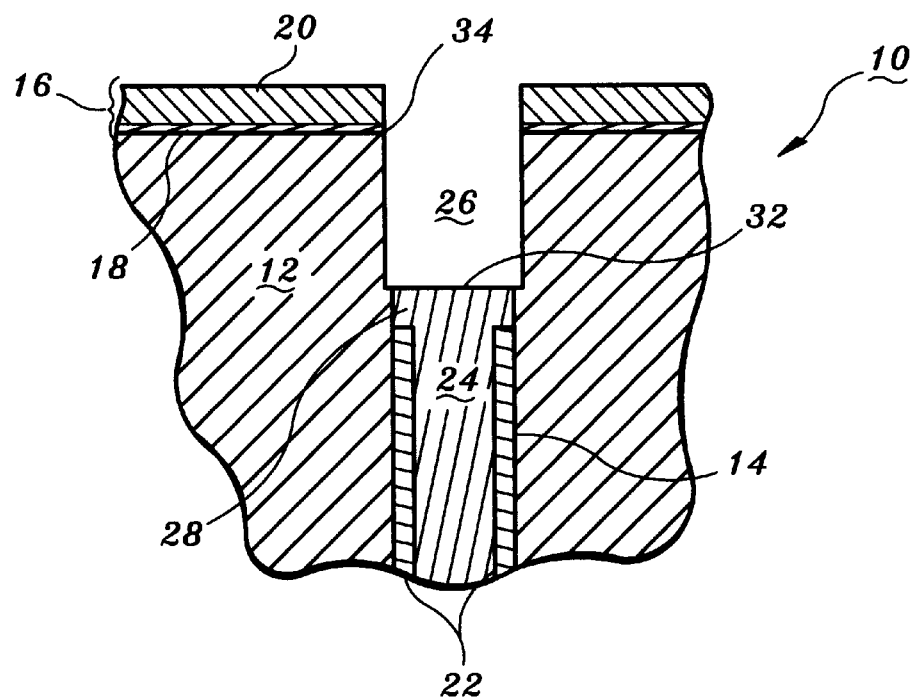
FIG. 1 is a cross-sectional view of a portion of a semiconductor device showing a trench structure having a collar and filled with a filler material.

Referring now in specific detail to the drawings in which like reference numerals identify similar or identical elements throughout the several views, and initially to FIG. 1, a portion of a semiconductor device 10 is shown. Semiconductor device 10 includes a substrate 12 preferably a silicon substrate although other materials are contemplated, for example gallium arsenide or silicon-on-insulator (SOI). A deep trench 14 is formed in substrate 12, through a pad stack 16 which preferably includes a pad oxide layer 18 and a pad nitride layer 20, by processes known to those skilled in the art. Pad oxide layer 18 is preferably formed by thermal oxidation although a deposition process may be used. Pad nitride layer 20 is preferably deposited on pad oxide layer 18. A collar 22 is formed in trench 14 for electrically isolating a portion of trench 14 from substrate 12. A lower portion of trench 14 (not shown) is further electrically isolated from substrate 12 by a thin dielectric layer (not shown) about the side and bottom of trench 14.

Trench 14 is filled with a conductive filler material 24, preferably polysilicon or doped polysilicon, other conductive materials may be used as well. Filler material 24 extends over a top portion of collar 22 and contacts substrate 12. A recess 26 is thereby left in trench 14. A buried strap 28 includes a top surface 32 which is between about 10 nm and about 600 nm below a top surface 34 of substrate 12.

Figure 2:
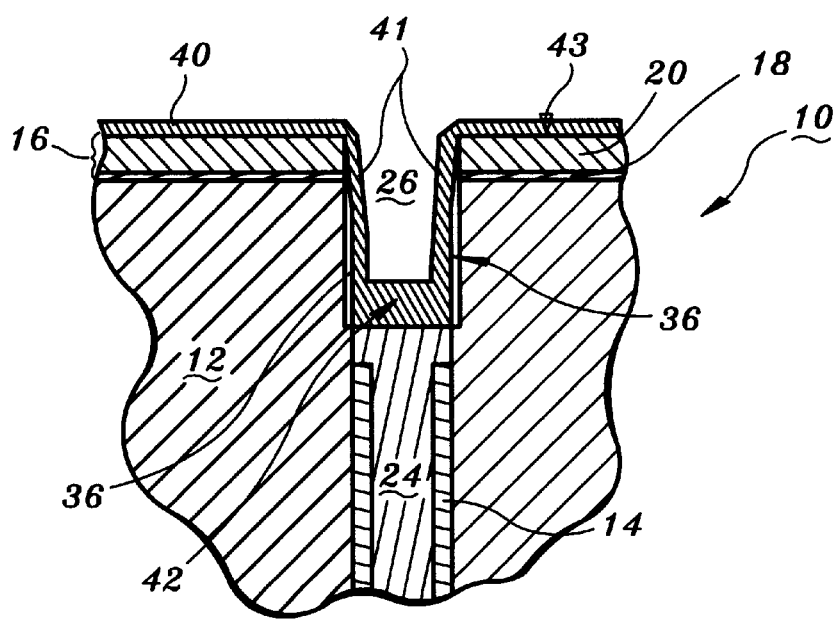
FIG. 2 is a cross-sectional view of the semiconductor device of FIG. 1 having a liner formed on trench sidewalls and a sub-atmospheric layer deposited on the liner and a buried strap in accordance with the present invention.

Referring to FIG. 2, a nitride liner 36 is deposited over pad stack 16 and inside recess 26. Nitride liner 36 is preferably silicon nitride, and preferably about 5 nm in thickness. Nitride liner 36 is removed from all surfaces except sidewalls of trench 14 as shown in FIG. 2, preferably using a reactive ion etch or equivalent process. A sub-atmospheric chemical vapor deposited (SACVD) layer 40 is deposited. SACVD layer 40 is preferably an oxide and more preferably an ozone rich TEOS layer described by Elbel et.

al, in "A new STI process based on selective oxide deposition", IEEE 1998 Symposium on VLSI Technology Digest of Technical Papers, pp. 208–209, incorporated herein by reference. SACVD layer 40 advantageously grows at a rate of about 5 times greater on silicon than on nitride, however other growth rates may be used for example about 2 times greater to about 25 times greater. During deposition of SACVD layer 40, growth of SACVD layer 40 selectively grows faster on filler material 24, which is preferably polysilicon, than on nitride liner 36 on the sidewalls of trench 14 and on pad nitride layer 20. In a preferred embodiment, SACVD layer 40 is about 500 Angstroms for a trench top portion 42 and about 100 Angstroms on a portion 41 on nitride liner 36. Advantageously, the reduced thickness on pad nitride 20 and on side walls of trench 14 of SACVD layer 40 permits removal of SACVD layer 40 from the side walls and surface 43 of pad stack 16 by a single etching step which also simultaneously reduces SACVD layer 40 to form an improved trench top isolation layer 44 (FIG. 3).

Figure 3:
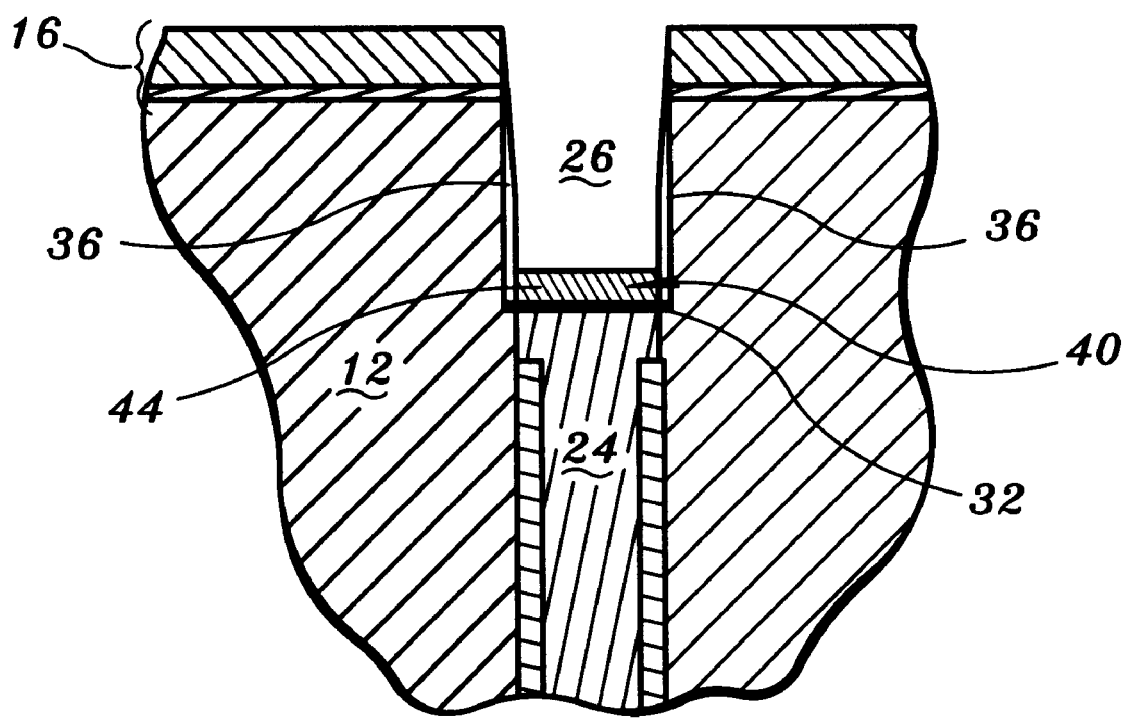
FIG. 3 is a cross-sectional view of the semiconductor device of FIG. 2 having the sub-atmospheric deposited layer etched back to form a trench top isolation layer in accordance with the present invention.

Referring to FIG. 3, an optional densification process may be performed to SACVD layer 40 located adjacent to trench top portion 42 (FIG. 2). This densification process may be performed by oxidation and/or nitridation of top surface 32 through SACVD layer 40. This densification process enhances electrical isolation between filler material 24 which forms a storage node and a gate conductor which will deposited in recess 26 in later processing steps. A wet etching process, for example, an HF etch, is performed to remove SACVD layer 40 from nitride liner 36. In one embodiment, about 100 Angstroms is removed to clear the sidewalls of SACVD layer 40 and trench top portion 42 (FIG. 2) is also etched back about 100 Angstroms. The remaining SACVD layer 40 forms a trench top isolation layer 44. Since trench top isolation layer 44 is formed by a deposition process, the thickness of SACVD layer 40 is well controlled. By later wet etching back SACVD layer 40, a well controlled thickness of trench top isolation layer 44 is achieved by eliminating conventional filling and recessing as performed in the prior art. In a preferred embodiment, trench top isolation layer 44 has a thickness between about 10 nm to about 100 nm, and more preferably between about 30 nm to about 40 nm.

Figure 4:
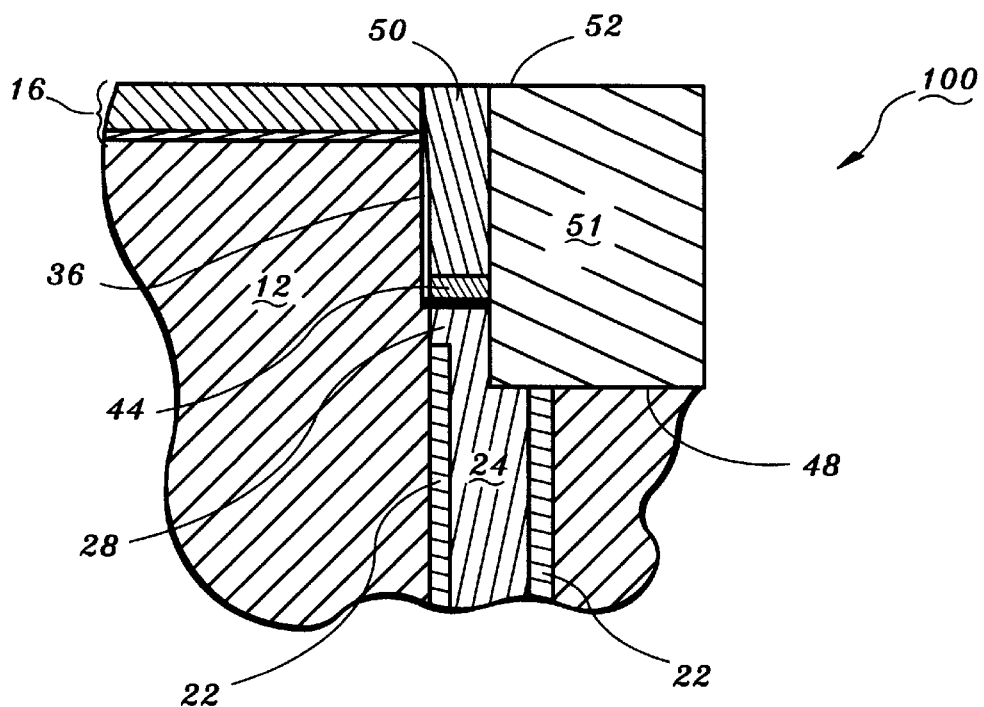
FIG. 4 is a cross-sectional view of the semiconductor device of FIG. 3 having shallow trench isolation implemented in accordance with the present invention.
Figure 5:
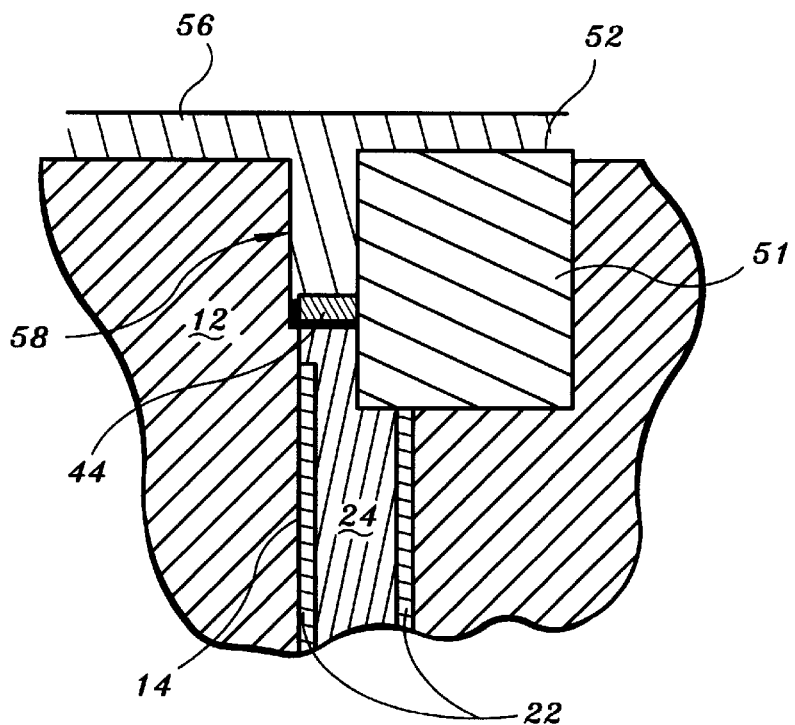
FIG 5 is a cross-sectional view of the semiconductor device of FIG. 4 showing a conductive material formed in a remaining portion of the trench in accordance with the present invention.
Figure 6:
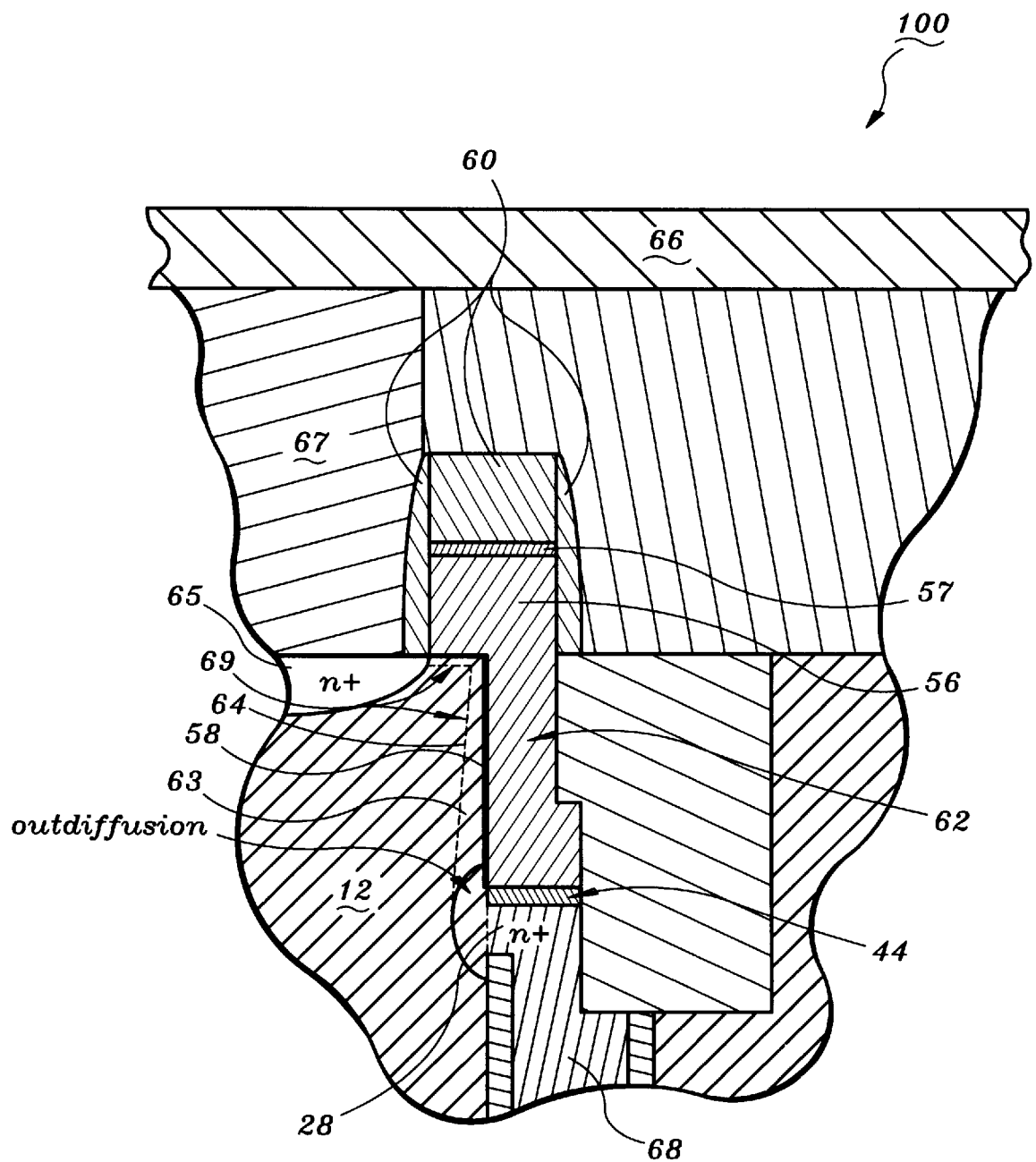
FIG. 6 is a cross-sectional view of the semiconductor device of FIG. 5 showing a vertical transistor with a gate stack formed in the trench and a bitline contact and bitline coupled to a diffusion region of the transistor in accordance with the present invention.

Referring to FIGS. 4–6, a method in accordance with the present invention will now be described for shallow trench isolation (STI). Referring to FIG. 4, portions of a device 100 are etched to form a position 48 for shallow trench isolation materials. A portion of substrate 12, buried strap 28, trench top isolation layer 44, collar 22, a dummy polysilicon material 50 and filler material 24 are removed to form position 48. Position 48 is filled with a dielectric material 51, preferably an oxide, such as silicon dioxide. A top surface 52 is planarized to prepare surface 52 for further processing.

Referring to FIG. 5, top surface 52 may be deglazed to remove any remaining oxides therefrom. Dummy polysilicon material 50 is recessed to remove material 50. Nitride liner 36 is stripped from trench 14 sidewall. Pad stack 16 is stripped from substrate 12, preferably by a wet etching process. The remaining structure includes controlled trench top isolation layer 44 and is now ready for a sacrificial oxide deposition and ion implantation to form devices on device 100. After ion implantation, the sacrificial oxide layer (not shown) is removed. A thin gate oxide layer 58 is formed prior to deposition of conductive material 56. A conductive material 56 preferably includes polysilicon or doped polysilicon and is deposited as shown. Gate oxide 58 is formed between a gate conductor 62 (see FIG. 6) (conductive material 56 in trench 14) and substrate 12 as is known in the art.

Referring to FIG. 6, a conductive layer 57, for example a silicide, such as tungsten silicide, may be deposited on conductive material 56. Conductive material 56 and conductive layer 57 are isolated by a dielectric material 60 of the gate structure which is formed as known to those skilled in the art. Dielectric material 60 may include an oxide or a nitride, preferably silicon nitride. Conductive material 56 and conductive layer 57 form gate conductor 62 which is adjacent to a portion 64 of substrate 12. Portion 64 functions as a channel 63 for a vertical transistor 69. The vertical transistor 69 has a bitline 66 as a source and a storage node 68 as a drain. Bitline 66 connects to a bitline contact 67 which connects to a diffusion region 65. As shown in FIG. 6, gate conductor 62 is separated from buried strap 28 by trench top isolation layer 44. Buried strap 28 includes dopants which outdiffuse to connect storage node 68 to diffusion region 65 via channel 63. As described, isolation layer 44 is reliably formed to a predetermined thickness in accordance with the present invention. Although shown for a vertical transistor configuration the method described is easily extended to other transistors and devices.

Figure 7:
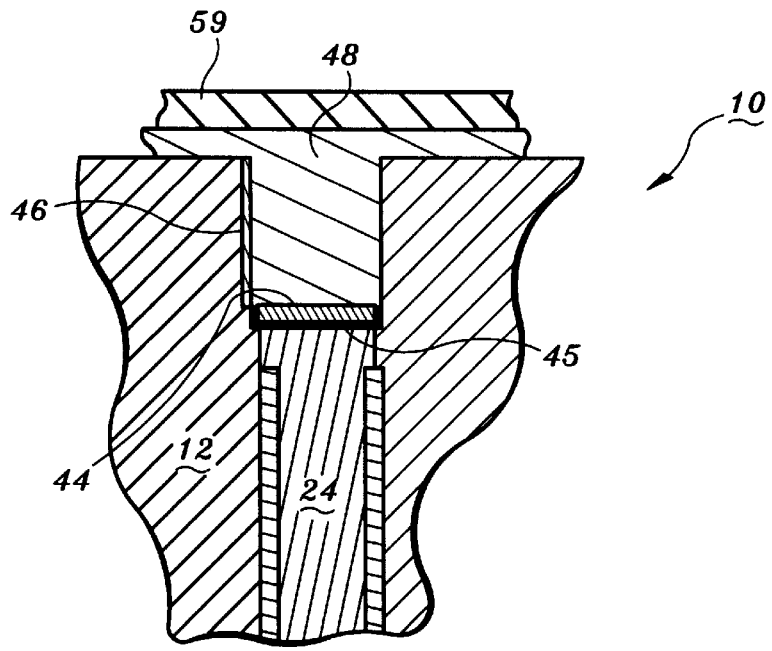
FIG. 7 is a cross-sectional view of the semiconductor device of FIG. 3 having a conductive material deposited on the trench top isolation layer and a gate oxide in preparation for the formation of raised shallow trench isolation in accordance with the present invention.
Figure 8:
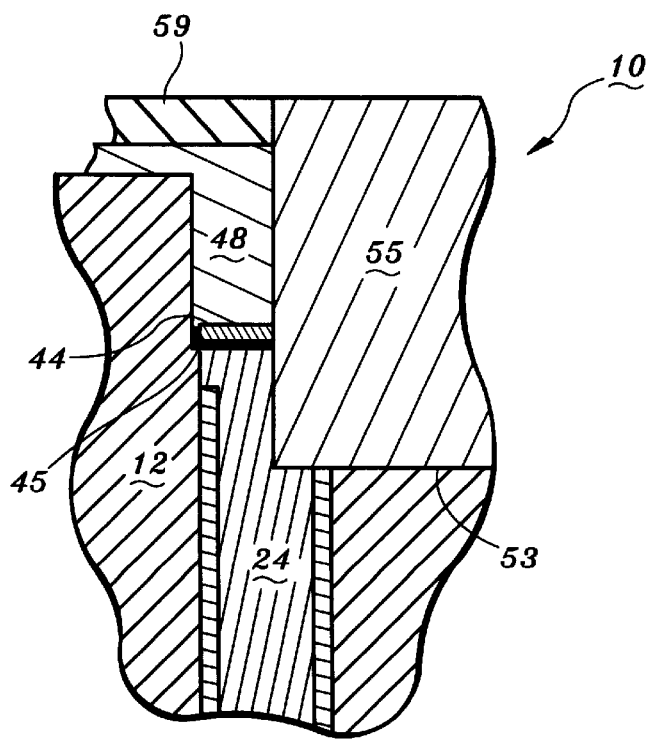
FIG. 8 is a cross-sectional view of the semiconductor device of FIG. 7 having a position etched and filled for the formation of raised shallow trench isolation in accordance with the present invention.
Figure 9:
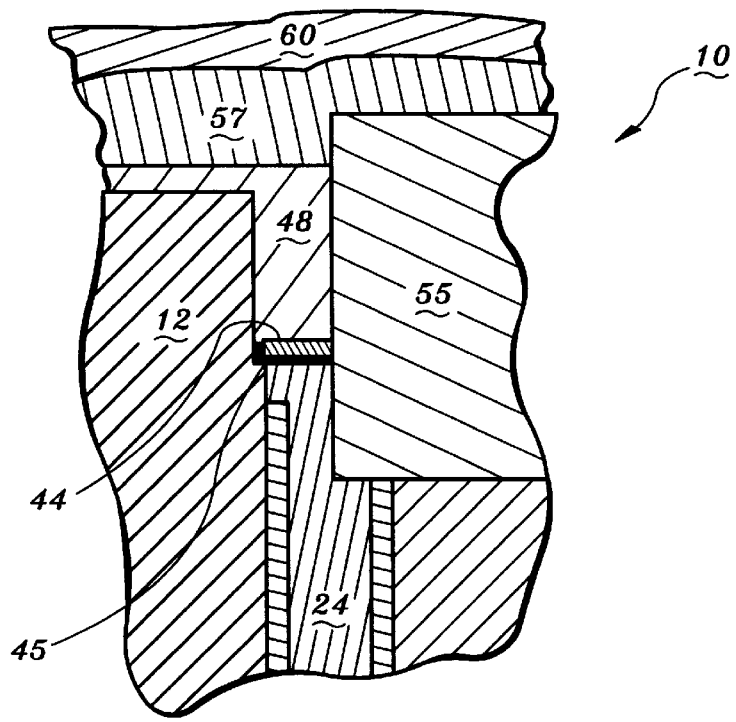
FIG. 9 is a cross-sectional view of the semiconductor device of FIG. 8 having a dielectric layer and a conductive layer deposited on the raised shallow trench isolation material and on a top surface of the device in accordance with the present invention.
Figure 10:
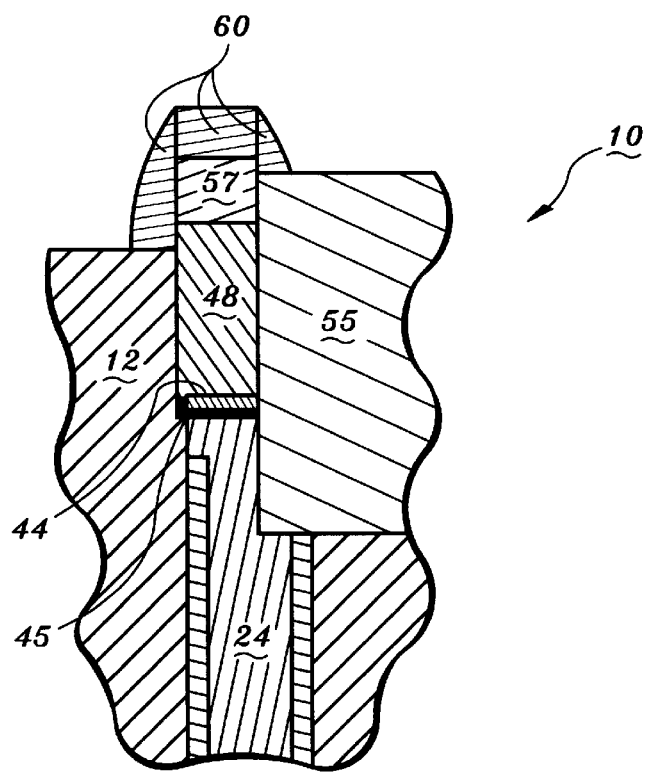
FIG 10 is a cross-sectional view of the semiconductor device of FIG. 9 having a gate structure formed in the trench and on the raised shallow trench isolation in accordance with the present invention.

Referring to FIG. 7, the formation of a controlled isolation layer for raised shallow trench isolation (RSTI) is described. During further processing of the structure of FIG. 3, nitride liner 36 is stripped from trench 14 sidewall. Pad stack 16 is stripped from substrate 12, preferably by a wet or dry etching process. Wet etching may include etching with hot phosphoric acid, followed by a short HF etch or HF glycerol etch. Dry etching may include chemical downstream etching or reactive ion etching. The remaining structure includes trench top isolation layer 44 with an optionally oxidized layer 45 and is now ready for a sacrificial oxide deposition and ion implantation to form a vertical transistor. After removing the sacrificial oxide layer (not shown), a gate oxide 46 is formed, followed by a conductive material 48 deposition (part of a gate conductor) and a dielectric layer deposition 59, preferably a nitride. Conductive material 48 deposition can fill or underfill the trench recess. Portions of device 10 are etched to form an isolation trench 53 for raised shallow trench isolation materials 55, which preferably include an oxide as shown in FIG. 8. In FIG. 9, after stripping dielectric layer 59, conductive material 57 and dielectric material 60 are deposited and formed into a gate structure in FIG. 10 as is known to those skilled in the art. Although shown and described for a vertical transistor configuration the method disclosed is easily extended to other transistors and devices.

Figure 11:
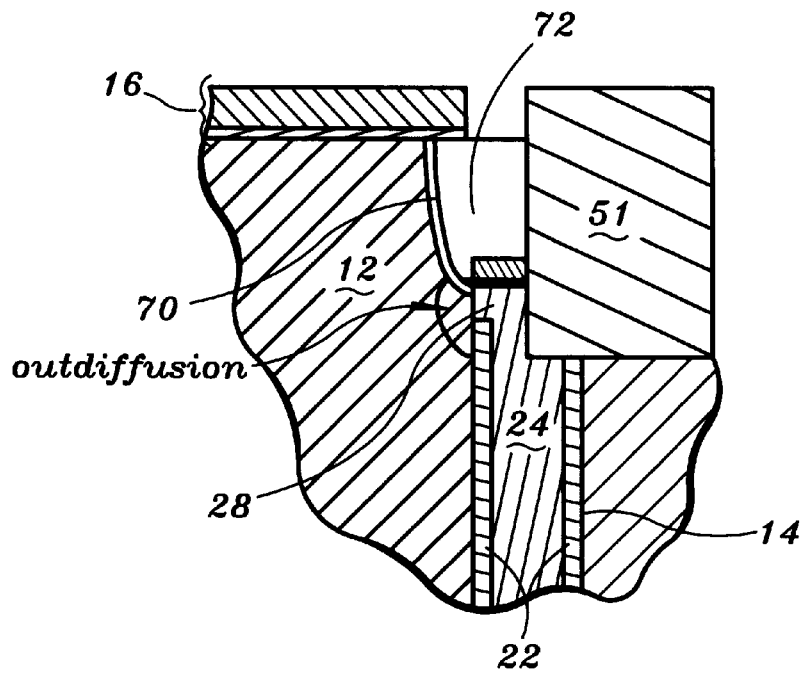
FIG 11 is a cross-sectional view of a semiconductor device showing a recess formed in a substrate for a vertical transistor with improved coupling between a channel and a buried strap in accordance with the present invention.

Referring to FIG. 11, it is advantageous to move a transistor channel 70 further away from trench 14 to enhance overlap with buried strap outdiffusion without impacting device performance by formation of deep junctions. After a dummy polysilicon removal step, nitride liner 36 is removed as described above. An etching process is preferably performed to remove a portion of substrate 12 such that when channel 70 is formed, channel 70 is further away from trench 14 and more easily connects with buried strap 28 outdiffusion. Substrate 12 is overetched, preferably by a dry etching process such as reactive ion etching or chemical downstream etching, such that a recess 72 is formed. Processing continues thereafter as normal to form the vertical transistor as described above. Although STI is shown in FIG. 11, the process may be performed for RSTI as well.

Figure 12:
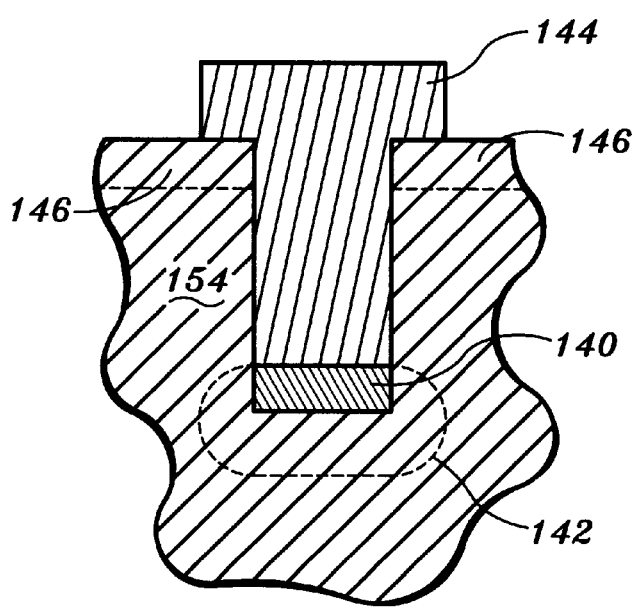
FIGS. 12–14 are cross-sectional views of various buried bitline configurations implemented in accordance with the present invention.
Figure 13:
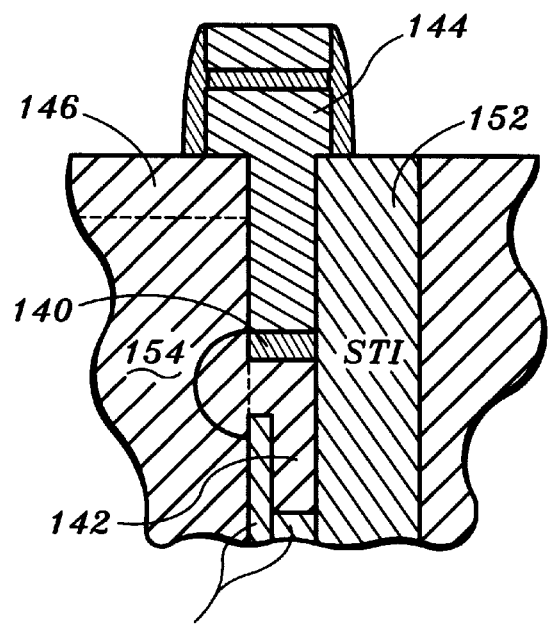
Figure 14:
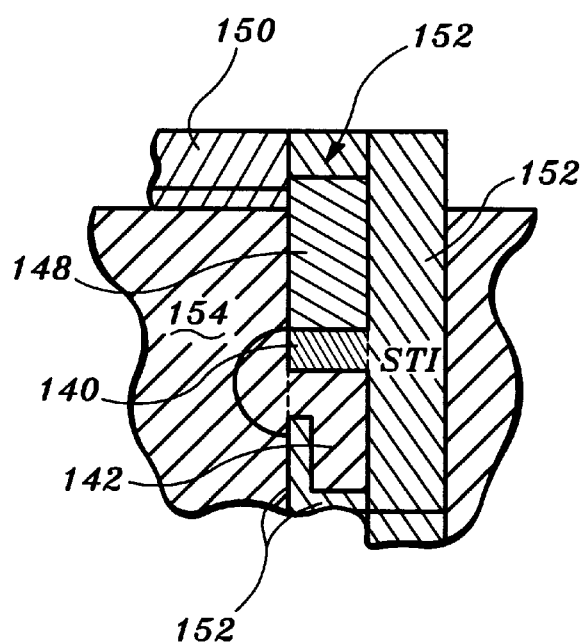

Referring to FIGS. 12–14, a SACVD layer 140 may be employed in many applications. SACVD layer 140 may be employed to isolate any doped, buried region serving, for example, as a storage node, a buried bitline or other source/drain connections, preferably related to vertical transistors.

In FIGS. 12–14, SACVD layer 140 is formed on an appropriately doped polysilicon buried bitline 142. Various gate structures 144 may be implemented to connect bitline 142 to source/drain regions 146. A conductive material 148 may also be used (FIG. 14) to connect bitline 142 to a diffusion region 150. Dielectric regions are indicated by 152 and substrates are indicated by 154.

Having described preferred embodiments for a novel device and method for forming deep trench isolation layers for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for controlling isolation layer thickness in trenches for semiconductor devices comprising the steps of:
   providing a trench having a conductive material formed therein and having exposed sidewalls above the conductive material;
   forming a liner on the sidewalls above the conductive material;
   depositing a selective oxide deposition layer on the conductive material and the liner, the selective oxide deposition layer selectively growing at an increased rate on the conductive material as compared to the liner of the sidewalls; and
   removing the selective oxide deposition layer except for a portion in contact with the conductive material to form an isolation layer on the conductive material in the trench.

2. The method as recited in claim 1, wherein the step of depositing the selective oxide deposition layer includes depositing the selective oxide deposition layer by chemical vapor deposition.

3. The method as recited in claim 1, wherein the step of depositing the selective oxide deposition layer comprises depositing an ozone activated TEOS oxide.

4. The method as recited in claim 1, wherein the increased rate of growing is about five times greater on the conductive material than on the liner.

5. The method as recited in claim 1, wherein the step of forming a liner on sidewalls includes forming a nitride liner.

6. The method as recited in claim 1, wherein the thickness of the trench top isolation layer is between about 10 nm to about 200 nm.

7. The method as recited in claim 1, wherein the conductive material includes polysilicon and the method further comprises the step of oxidizing the polysilicon below the isolation layer.

8. The method as recited in claim 1, further comprises the step of removing the liner from the trench sidewalls.

9. A method for fabricating a vertical transistor comprising the steps of:
   providing a substrate having trenches formed therein, each trench having a storage node formed therein, the storage node having a buried strap;
   forming a liner on sidewalls of the trench above the buried strap;
   depositing a selective oxide deposition layer on the buried strap and the sidewalls, the selective oxide deposition deposited layer selectively growing at an increased rate on the buried strap as compared to the liner of the sidewalls; and
   removing the selective oxide deposition layer except for a portion in contact with the buried strap to form a trench top isolation layer; and
   forming a gate conductor in the trench such that a channel is formed adjacent to the gate conductor for providing electrical conduction between the buried strap and a conductive line upon activation of the gate conductor.

10. The method as recited in claim 9, further comprising the steps of laterally etching the substrate to form a recess into the substrate such that the recess extends beyond the trench, the recess being in communication with the trench; and
   providing a channel along the recess in the substrate such that electrical conduction between the buried strap and the conductive line is provided therethrough upon activation of the gate conductor.

11. The method as recited in claim 10, wherein the step of laterally etching includes laterally etching by a dry etch process.

12. The method as recited in claim 9, wherein the conductive line includes a bitline.

13. The method as recited in claim 9, wherein the step of depositing the selective oxide deposition layer includes depositing the selective oxide deposition layer by chemical vapor deposition.

14. The method as recited in claim 9, wherein the step of depositing the selective oxide deposition layer includes depositing an ozone activated TEOS oxide.

15. The method as recited in claim 9, wherein the increased rate of growing is about five times greater on the buried strap than on the liner of the sidewalls.

16. The method as recited in claim 9, wherein the step forming a liner on sidewalls includes forming a nitride liner.

17. The method as recited in claim 9, wherein the thickness of the trench top isolation layer is between about 10 nm to about 200 nm on the buried strap.

18. The method as recited in claim 9, wherein the buried strap includes polysilicon and further comprises the step of densifying the polysilicon below the trench top isolation layer.

19. The method as recited in claim 9, further comprising the step of removing the liner from the trench sidewalls after the step of depositing the selective deposition layer.

* * * * *